(12) United States Patent
Chavali et al.

(10) Patent No.: US 10,373,900 B2
(45) Date of Patent: Aug. 6, 2019

(54) TIN-ZINC MICROBUMP STRUCTURES AND METHOD OF MAKING SAME

(71) Applicant: Intel Corporation, Santa Clara, CA (US)

(72) Inventors: Sri Chaitra J. Chavali, Chandler, AZ (US); Amanda E. Schuckman, Scottsdale, AZ (US); Kyu Oh Lee, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/806,231

(22) Filed: Nov. 7, 2017

(65) Prior Publication Data

US 2018/0076119 A1     Mar. 15, 2018

Related U.S. Application Data

(62) Division of application No. 15/267,040, filed on Sep. 15, 2016, now Pat. No. 9,837,341.

(51) Int. Cl.
*H01L 21/48* (2006.01)
*H01L 23/00* (2006.01)
*H01L 23/498* (2006.01)

(52) U.S. Cl.
CPC ...... *H01L 23/49816* (2013.01); *H01L 21/486* (2013.01); *H01L 23/49827* (2013.01);
(Continued)

(58) Field of Classification Search
CPC ............... H01L 23/49816; H01L 24/17; H01L 21/4853; H01L 23/49866; H01L 23/49838; H01L 23/49827; H01L 23/498; H01L 23/00; H01L 21/48; H01L 2924/01022; H01L 2924/15747; H01L 2924/15321; H01L 2224/16238; H01L 2224/13118; H01L 2224/13111
(Continued)

(56) References Cited

U.S. PATENT DOCUMENTS 6,242,349 B1 *   6/2001   Nogami ............ H01L 21/76843
                                                      205/184
6,582,579 B1     6/2003   Uzoh
(Continued)

OTHER PUBLICATIONS

International Preliminary Report on Patentability for International Patent Application No. PCT/US2017/046769, dated Mar. 28, 2019, 8 pages.

*Primary Examiner* — Alexander O Williams
(74) *Attorney, Agent, or Firm* — Schwabe, Williamson & Wyatt, P.C.

(57) ABSTRACT

Techniques and mechanisms for providing effective connectivity with surface level microbumps on an integrated circuit package substrate. In an embodiment, different metals are variously electroplated to form a microbump which extends through a surface-level dielectric of a substrate to a seed layer including copper. The microbump includes a combination of tin and zinc that mitigates precipitation of residual copper by promoting the formation of miconstituents in the microbump. In another embodiment, the microbump has a mass fraction of zinc, or a mass fraction of tin, that is different in various regions along a height of the microbump.

8 Claims, 7 Drawing Sheets

(52) U.S. Cl.
CPC ........ *H01L 24/17* (2013.01); *H01L 23/49833* (2013.01); *H01L 2224/13111* (2013.01); *H01L 2224/13118* (2013.01); *H01L 2224/16238* (2013.01); *H01L 2924/01022* (2013.01); *H01L 2924/15321* (2013.01); *H01L 2924/15747* (2013.01)

(58) Field of Classification Search
USPC ........ 257/706, 774, 773, 737, 738, 778, 783
See application file for complete search history.

(56) References Cited

U.S. PATENT DOCUMENTS

| | | | |
|---|---|---|---|
| 6,952,052 B1 | 10/2005 | Marathe | |
| 9,147,663 B2 | 9/2015 | Liu | |
| 9,401,350 B1 | 7/2016 | We | |
| 2005/0218523 A1* | 10/2005 | Dubin | B82Y 10/00 257/762 |
| 2007/0238265 A1* | 10/2007 | Kurashina | H01L 21/2885 438/470 |
| 2008/0314628 A1 | 12/2008 | Song | |
| 2011/0101527 A1* | 5/2011 | Cheng | H01L 24/11 257/738 |
| 2011/0247865 A1* | 10/2011 | Tsurumi | H05K 3/4661 174/255 |
| 2012/0055612 A1* | 3/2012 | Ahmed | C25D 3/54 156/151 |

\* cited by examiner

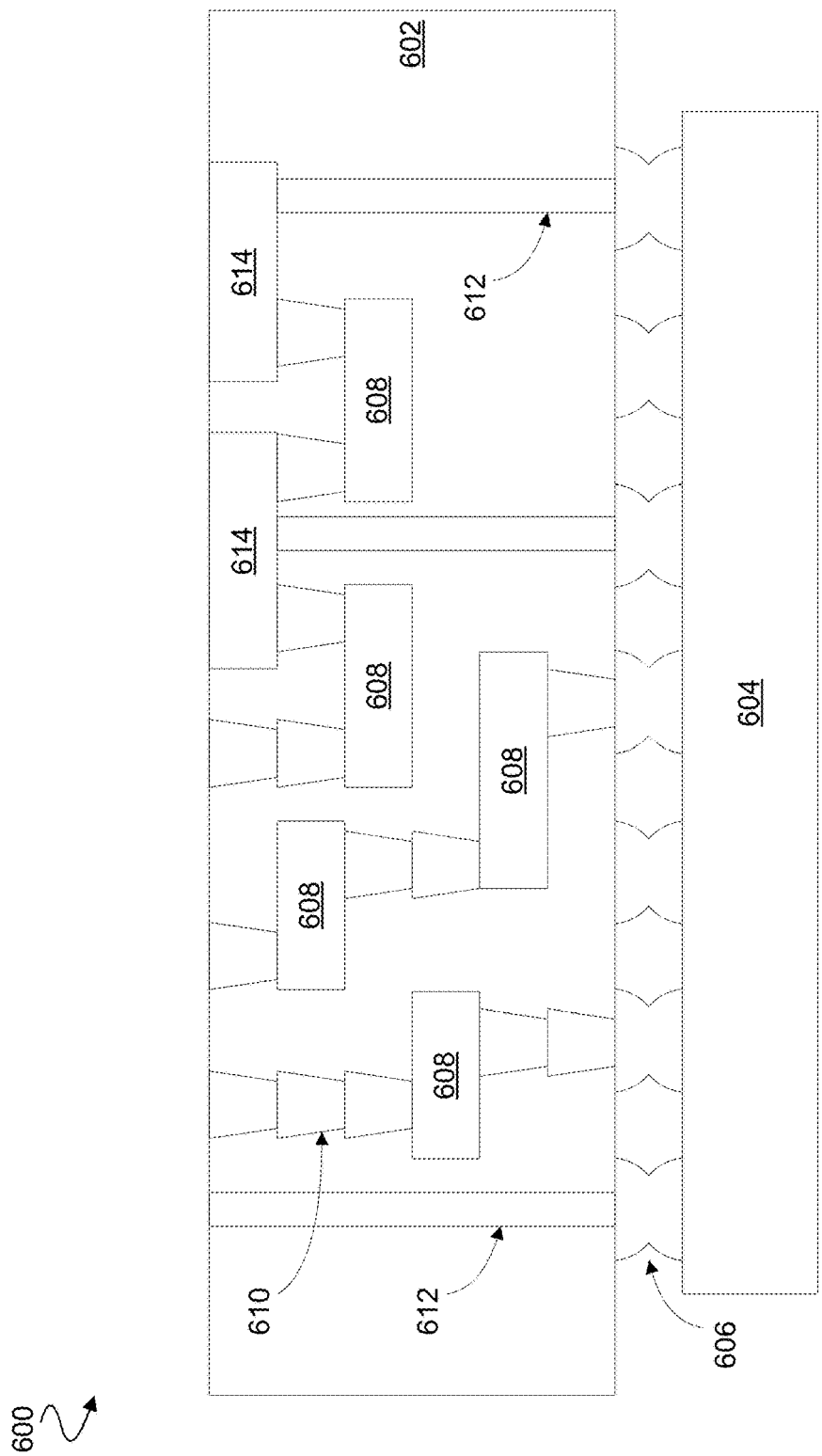

TIN-ZINC MICROBUMP STRUCTURES AND METHOD OF MAKING SAME

CROSS-REFERENCE TO RELATED CASES

This application is a divisional of U.S. patent application Ser. No. 15/267,040, filed on Sep. 15, 2016, the entire contents of which are hereby incorporated by reference herein.

BACKGROUND

1. Technical Field

Embodiments of the present invention generally relate to the field of integrated circuit package substrates and more particularly, but not exclusively, to fabrication processing that provides microbump interconnects.

2. Background Art

Integrated circuits are typically formed on a semiconductor wafer made of materials such as silicon. The semiconductor wafer is then processed to form various electronic devices. The wafers is usually diced into semiconductor chips (a chip is also known as a die), which may then be attached to a substrate. The substrate is typically designed to couple the die, directly or indirectly, to a printed circuit board, socket, or other connection. The substrate may also perform one or more other functions such as protecting, isolating, insulating, and/or thermally controlling the die.

The substrate (for example, an interposer) has traditionally been formed from a core made up of a laminated multilayer structure. Typically, microbumps and other such interconnect structures are variously formed in or on the structure to facilitate electrical coupling of a die to one or more other devices. Coreless substrates have been developed to decrease the thickness of the substrate. In a coreless substrate, a removable core layer is typically provided, conductive and dielectric layers built up on the removable core, and then the core is removed. The coreless substrate typically includes a plurality of vias formed therein interlayer electrical connections.

As successive generations of fabrication technologies continue to scale in size, metallurgical properties of various materials have an increasingly significant impact on the formation and operation of interconnect structures. Accordingly, there is an increasing demand for incremental improvements in the fabrication of structures to interconnect microelectronic circuit devices.

BRIEF DESCRIPTION OF THE DRAWINGS

The various embodiments of the present invention are illustrated by way of example, and not by way of limitation, in the figures of the accompanying drawings and in which:

FIG. 6 is a cross-sectional view of an interposer in accordance with one embodiment.

DETAILED DESCRIPTION

Embodiments discussed herein variously provide techniques and mechanisms for improved metallurgical properties of microbump structures. Some embodiments mitigate residual metal precipitation that might otherwise increase the possibility of unreliable interconnects and/or unintended conductive paths being formed.

For example, in some conventional metallization techniques, copper (Cu) is susceptible to being drawn from a seed layer and dissolved into an adjoining metal as part of an intermetallic compound (IMC) within a microbump being formed on the seed layer. The IMC is typically broken down in a subsequent reflow process, resulting in a relatively high copper level in or on the microbump itself. Some embodiments mitigate the formation of residual copper—e.g., that might otherwise form as a result of reflow processing—on a microbump and/or an adjoining surface. For example, a microbump may include a combination of metals that promotes the formation of microconstituent structures. As a result of an increased volume fraction of such microconstituents, a microbump may be relatively more likely to retain copper (rather than precipitate such copper out as a residue onto nearby surfaces). The term "microbump" is variously used to refer to either a conductive contact of a device, or a solder joint formed form such a conductive contact. Unless otherwise indicated, "solder joint" refers herein to a solder joint formed by soldering with a microbump (where such a solder joint could also be referred to colloquially as a "microbump").

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including a substrate including interconnect structures to provide connectivity to integrated circuitry.

Figure 1A:
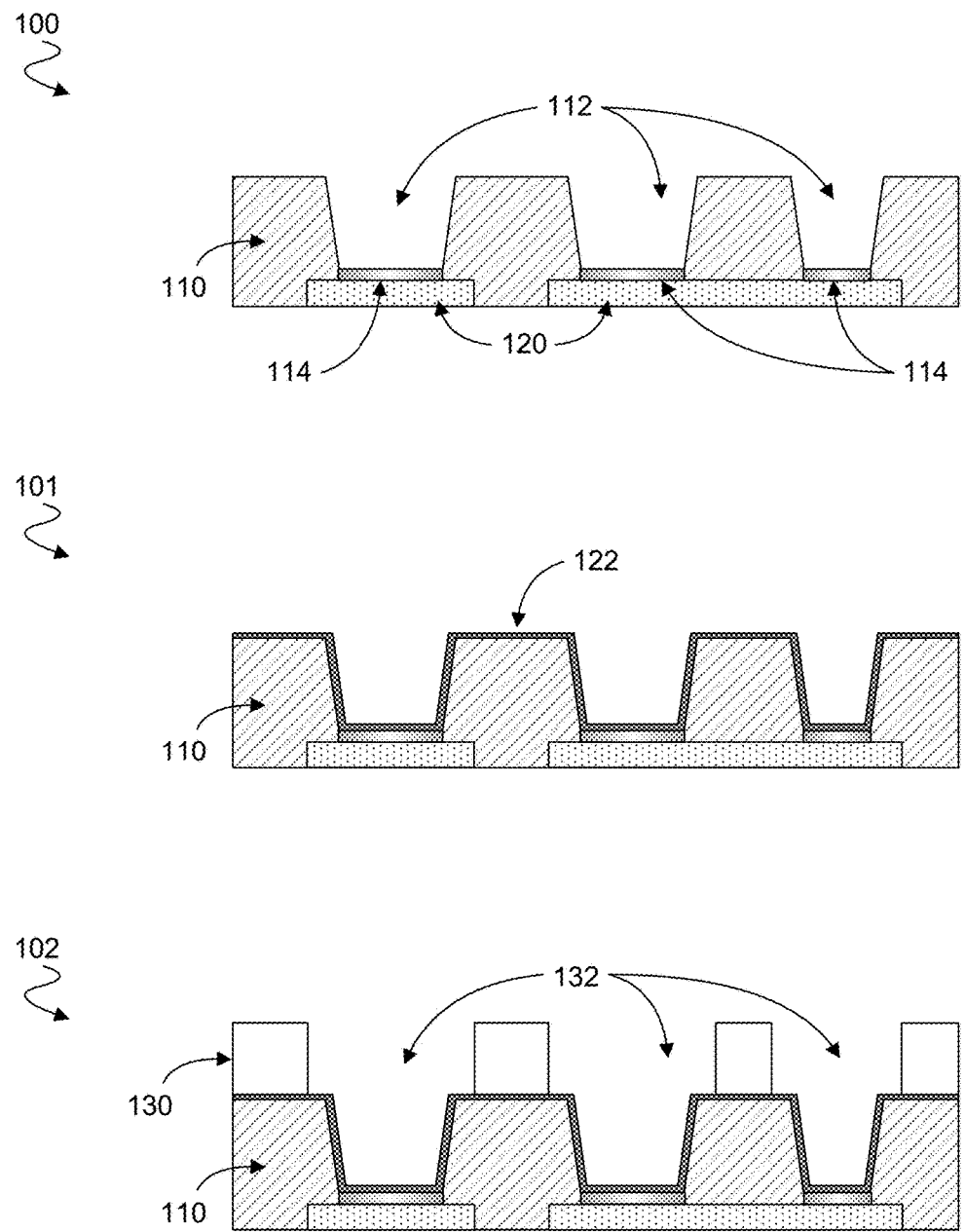
FIGS. 1A, 1B are cross-sectional side views of processing to form a microbump according to an embodiment.
Figure 1B:
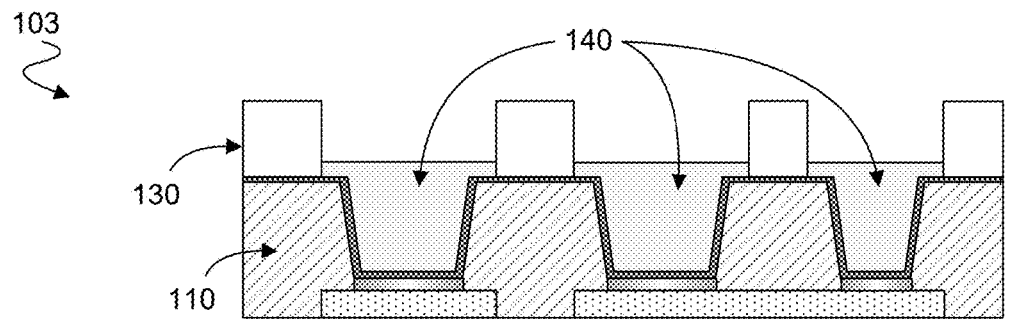
Figure 1B:
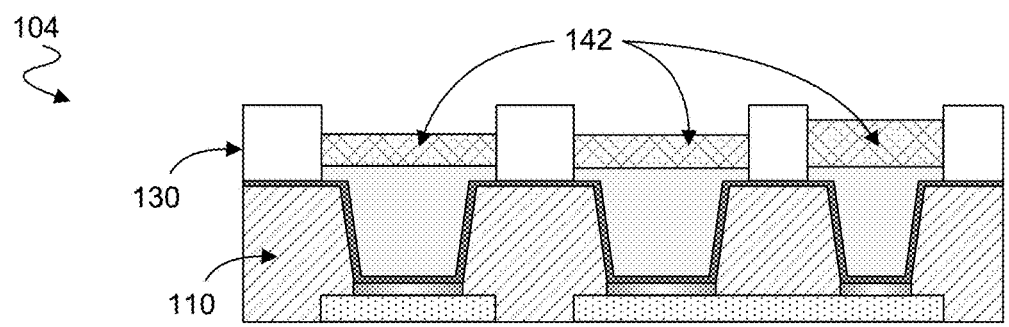
Figure 1B:
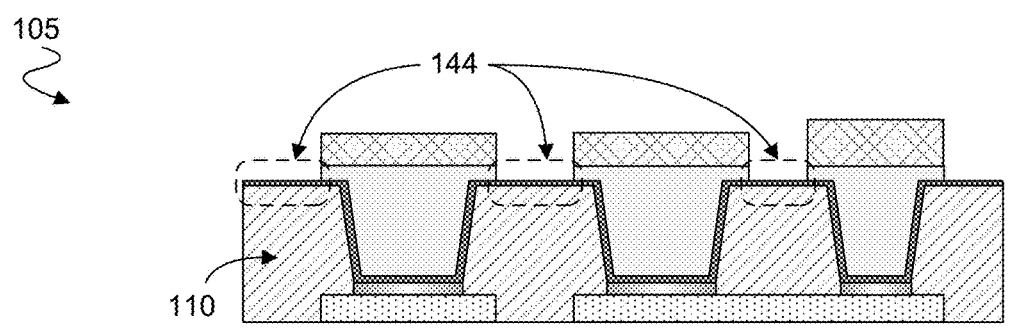
Figure 2:
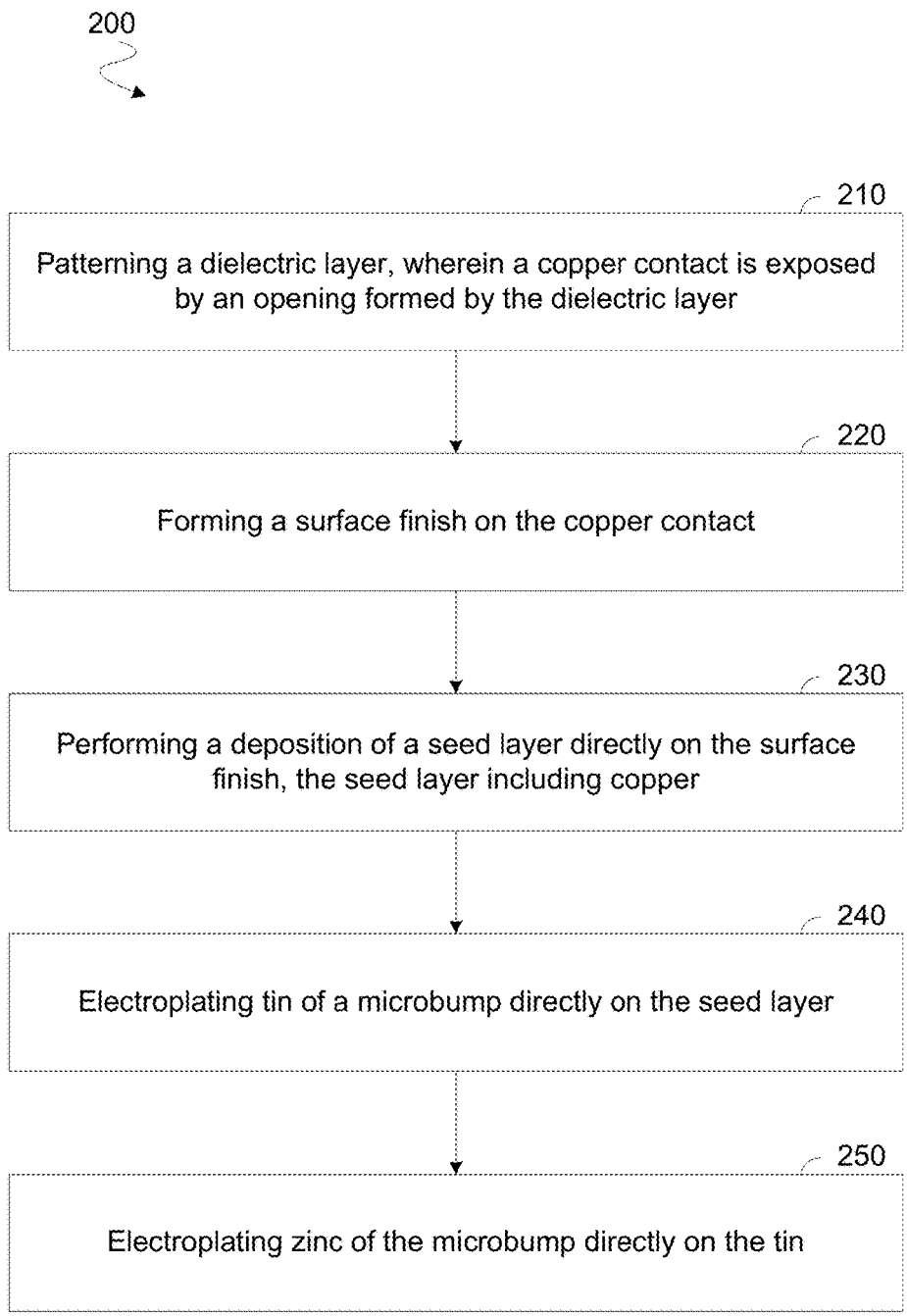
FIG. 2 is a flow diagram illustrating elements of a method to form one or more microbumps according to an embodiment.

FIG. 2 is a flow diagram of a method 200 for fabricating substrate structures of a microelectronic device in accordance with another embodiment. To illustrate certain features of various embodiments, method 200 is described herein with reference to FIGS. 1A, 1B. Cross-sectional views shown in FIGS. 1A, 1B variously illustrate respective stages 100-105 of a substrate fabrication process—such as method 200—in accordance with one exemplary embodiment. However, in different embodiments, method 200 may manufacture structures other than, or in addition to, those illustrated by stages 100-105. In one embodiment, processing such as that illustrated by stages 100-105 and/or method 200 is to form microbumps—of an interposer or other such substrate—that facilitate coupling to an integrated circuit die.

Method 200 may include, at 210, patterning a dielectric layer, wherein a copper contact is exposed by an opening formed by the dielectric layer. The dielectric layer may include a dry film resist (DFR), or any of a variety of other such materials adapted from conventional substrate fabrication techniques. For example, a dielectric layer (e.g., a material of the surface dielectric layer 110 shown at stage 100) may be laminated or otherwise deposited over a patterned metal layer (e.g., sub-surface-level metal layer 120) in a substrate build-up layer. Dielectric layer 110 and sub-surface-level metal layer 120 may include some or all of the respective features of dielectric layer 110 and sub-surface-level metal layer 120, for example.

The patterning at 210 may include operations such as those of the patterning at 210, for example. At operation 210, one or more openings (e.g., formed by the illustrative via holes 112 shown in stage 100) may be laser drilled or otherwise formed into the dielectric layer (e.g., surface dielectric layer 110) to expose contacts including respective portions of the underlying metal layer 120. In an embodiment, method 200 further comprises, at 220, forming a surface finish on the copper contact. Referring to the illustrative stage 100, the forming at 220 may include variously depositing surface finish portions 114 on respective exposed contacts of the sub-surface level metal layer 120. Surface finish portions 114 may function as respective barrier layer regions formed, for example, using electroless plating, PVD (sputtering, for example) or other such processes to form on the copper contact a tin layer (e.g., having a thickness of 3 µm to 7 µm), a palladium layer (e.g., having a thickness of 20 µm to 60 µm) or a gold layer (e.g., having a thickness of 30 µm to 100 µm). The composition and/or thickness of such a surface finish may be adapted from conventional techniques, in some embodiments.

Method 200 may further comprise, at 230, performing a deposition of a seed layer (e.g., seed layer 122 in stage 101) on the copper contact, wherein the seed layer includes copper. For example, electroless plating or a physical vapor deposition (i.e., sputtering) technique may be used to deposit the seed layer 122. By way of illustration and not limitation, electroless plating of pure copper may form a seed layer having a thickness in a range of 0.3 µm to 1.0 µm. In another embodiment, a combination of copper and titanium (Ti) may be sputtered to form a seed layer having a thickness in a range of 50 nanometers (nm) to 250 nm. However, seed layer 122 may have any of various other compositions and/or thicknesses, in different embodiments. In other embodiments, the surface finish formation at 220 may be omitted, wherein the seed layer is instead deposited (at 230) directly on exposed copper of the contact.

In an embodiment, method 200 further comprises, at 240, electroplating tin directly on the seed layer, where the tin is to form part of a microbump structure of the substrate. For example, as shown at stage 102, a patterned layer 130 of a resist material may be formed over seed layer 122, where patterned layer 130 includes openings 132 that are variously aligned each over a respective one of holes 112. Deposition, patterning and/or other forming of patterned layer 130 may include operations adapted, for example, from any of a variety of lithographic (exposure and development) processes known in the art. As shown in stage 103, an electrolytic plating process may be performed to deposit tin 140 to fill holes 112 at least in part. By way of illustration and not limitation, tin 140 may be deposited to a thickness of at least some minimum amount (e.g., at least 1 µm to 10 µm) that provides for a recess free bump of tin in one of via holes 112. In some embodiments, tin 140 is electroplated to a level that is above a top side of surface dielectric layer 110 (for example, 1µm or more above a highest extent of seed layer 122) but, for example, below a top side of patterned layer 130.

Method 200 may further comprise, at 250, electroplating zinc (Zn) directly on the tin that was electroplated at 240—e.g., where the zinc is to also form in part the same microbump structure(s) including such tin. In the illustrative embodiment shown at stage 104, a subsequent electrolytic plating process is performed to deposit zinc 142 over tin 140—e.g., wherein a thickness of zinc 142 is in a range of 5 µm to 30 µm. For example, only tin 140—rather than any copper of seed layer 122—may be in direct contact with some or all bottom side portions of zinc 142 (at least prior to a reflow or other processing of microbump structures including tin 140 and zinc 142.

Although some embodiments are not limited in this regard, method 200 may include or be followed by additional processing to build on and/or modify structures formed by method 200. By way of illustration and not limitation, as illustrated at stage 105, the temporary patterned resist layer 130 may be subsequently removed to expose portions of the underlying seed layer 122. A reflow process may then be performed and/or grinding/polishing may be performed to mitigate any height difference between respective microbumps. Additionally or alternatively, a flash etch processing (or other such subtractive operation) may be subsequently performed to remove portions 144 of seed layer 122. Such flash etching may provide for electrical isolation of microbump structures from one another at a surface of dielectric layer 110. In various embodiments, a solder joint may be formed with the microbump—e.g., including performance of a thermocompression bonding (TCB) process such as one adapted from conventional techniques.

In some embodiments, the successive electroplating of tin 140 and zinc 142 promotes the formation of microconstituents (such as primary microconstituents) during reflow and/or other processing of a microbump. An increased volume fraction of primary microconstituents in a microbump may reduce the tendency of residual copper to precipitate out of a microbump and onto adjoining surfaces. Due to such electroplating—and in some embodiments, due to reflow—a microbump according to an embodiment may exhibit a mass fraction gradient (of zinc or tin, for example) along the height thereof. A mass fraction of zinc ("zinc mass fraction" herein) for a first region of a microbump may, for example, be different than a second zinc mass fraction for a second region of the microbump that, as compared to the first region, is relatively far from an underlying copper contact. The different fractional amounts of zinc (or tin) along the height of a microbump may exist at least prior to (and in some embodiments, after) a reflow processing of the microbump.

By way of illustration and not limitation, a bottom 10% of a volume of a first microbump may have a first zinc mass fraction, wherein a top 10% of a volume of the first microbump has a second zinc mass fraction, wherein the second zinc mass fraction differs from the first zinc mass fraction by at least 5% of the first zinc mass fraction. In such an embodiment, the second zinc mass fraction may differ from the first zinc mass fraction by at least 10% (for example, by at least 20%) of the first zinc mass fraction. Alternatively or in addition, a total volume of all zinc of the first microbump may be equal to at least 5% of a total volume of all tin of the first microbump. For example, the total volume of all zinc of the first microbump may be equal to at least 10% (in some embodiments, at least 20%) of the total volume of all tin of the first microbump. In some embodiments, a total zinc mass fraction (for the entire first microbump) is in a range of 5% to 30% of a total volume of the first microbump. For example, the total zinc mass fraction may be in a range of 5% to 20% (and in some embodiments, in a range of 10% to 15%) of the total volume.

Figure 3:
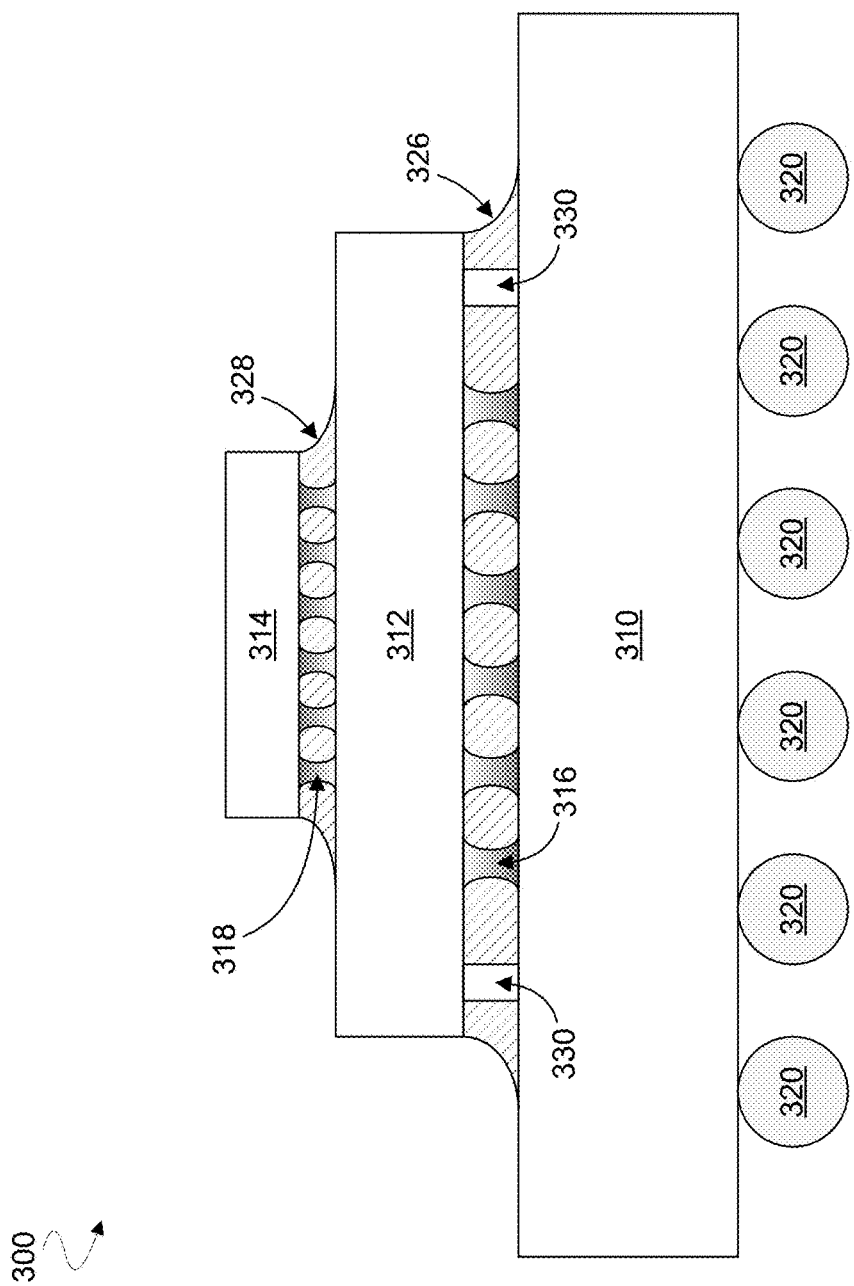
FIG. 3 is a cross-sectional diagram of an electronic assembly including interconnect structures according to an embodiment.

FIG. 3 illustrates an electronic assembly 300 including interconnect structures according to an embodiment. Electronic assembly 300 is merely one example of an embodiment wherein an integrated circuit die is coupled to a substrate (e.g., an interposer) via one or more solder joints formed from respective microbumps. Such microbumps may result from processing such as that represented by stages 100-105 and/or by method 200. As indicated above, a solder joint formed by soldering of a microbump according to an embodiment may itself be referred to as a "microbump."

A package substrate 310 of electronic assembly 300 may have an interposer 312 and a die 314 positioned thereon. The die 314 may be formed from a material such as silicon and have circuitry thereon that is to be coupled to the interposer 312. Although some embodiments are not limited in this regard, the package substrate 310 may in turn be coupled to another body, for example, a computer motherboard (not shown). One or more connections between the package substrate 310, interposer 312, and die 314—e.g., including some or all of solder joints 316 and 318—may have a zinc-tin metallurgy. In some embodiments, such connections may variously comprise an alloy of zinc and tin (and, in some embodiments, copper). By way of illustration and not limitation, a given one of solder joints 316, 318 may comprise mostly tin (e.g., at least 75% tin and, in some embodiments, at least 90% tin). In such an embodiment, a total amount of zinc in the solder joint may be at least 5% (e.g., at least 10% and, in some embodiments, at least 15%) the total amount of tin.

Connections between the package substrate 310 and another body may be made using any suitable structure, such as the illustrative solder bumps 320 shown. The package substrate 310 may include a variety of electronic structures formed thereon or therein. The interposer 312 may also include electronic structures formed thereon or therein. A variety of materials may be used for forming the package substrate and the interposer. In certain embodiments, the package substrate 310 is an organic substrate made up of one or more layers of polymer base material, with conducting regions for transmitting signals. In certain embodiments, the interposer 312 is made up of a ceramic base material including metal regions for transmitting signals. Although some embodiments are not limited in this regard, the electronic assembly 300 may include gap control structures 330—e.g., positioned between the package substrate 310 and the interposer 312. Such gap control structures 330 may mitigate a change in the height of the gap between the package substrate 310 and the interposer 312, which otherwise might occur during reflowing while die 314 is attached to interposer 312. FIG. 3 also shows the presence of underflow material 328 between the interposer 314 and die 316, and underflow material 326 between the package substrate 310 and the interposer 312. The underflow materials 326, 328 may be a polymer that is injected between the layers.

Figure 4:
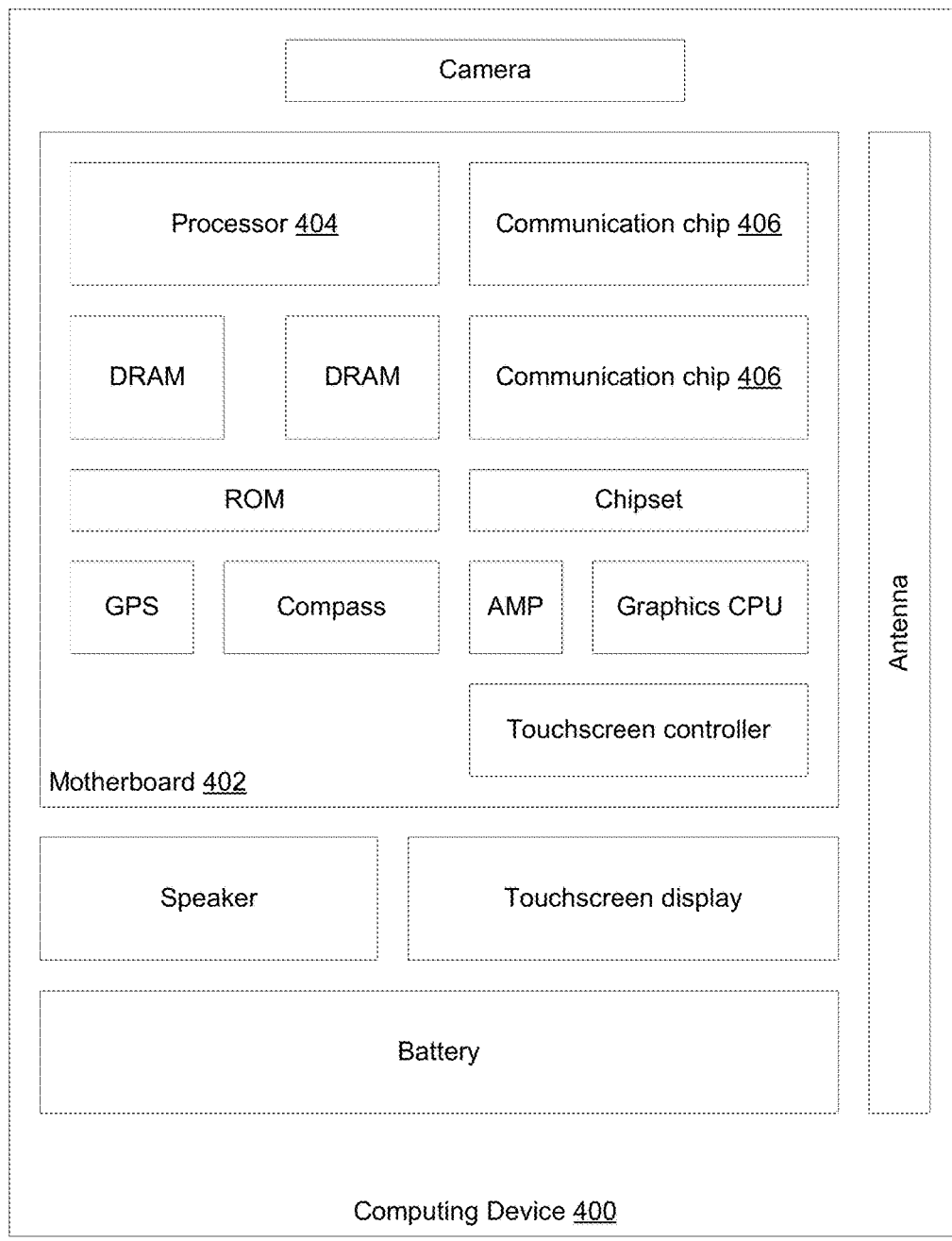
FIG. 4 is a functional block diagram illustrating elements of a computing device in accordance with one embodiment.

FIG. 4 illustrates a computing device 400 in accordance with one embodiment. The computing device 400 houses a board 402. The board 402 may include a number of components, including but not limited to a processor 404 and at least one communication chip 406. The processor 404 is physically and electrically coupled to the board 402. In some implementations the at least one communication chip 406 is also physically and electrically coupled to the board 402. In further implementations, the communication chip 406 is part of the processor 404.

Depending on its applications, computing device 400 may include other components that may or may not be physically and electrically coupled to the board 402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 406 enables wireless communications for the transfer of data to and from the computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 400 may include a plurality of communication chips 406. For instance, a first communication chip 406 may be dedicated to shorter range wireless communications such as Wi-Fi and Bluetooth and a second communication chip 406 may be dedicated to longer range wireless communications such as GPS, EDGE, GPRS, CDMA, WiMAX, LTE, Ev-DO, and others.

The processor 404 of the computing device 400 includes an integrated circuit die packaged within the processor 404. The term "processor" may refer to any device or portion of a device that processes electronic data from registers and/or memory to transform that electronic data into other electronic data that may be stored in registers and/or memory. The communication chip 406 also includes an integrated circuit die packaged within the communication chip 406.

In various implementations, the computing device 400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 400 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 5:
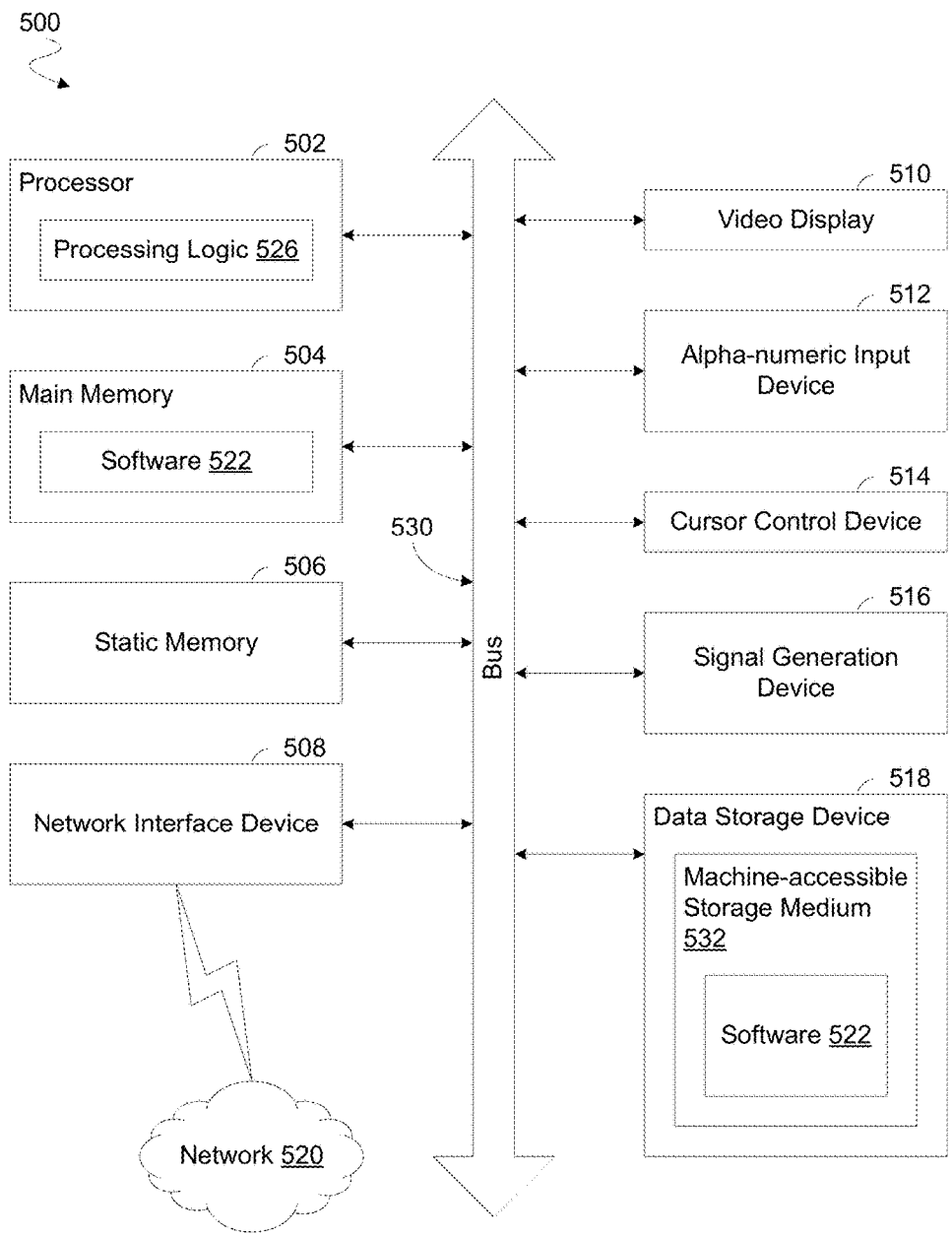
FIG. 5 is a functional block diagram illustrating elements of an exemplary computer system, in accordance with an embodiment.

FIG. 5 illustrates a diagrammatic representation of a machine in the exemplary form of a computer system 500 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 500 includes a processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

Processor 502 represents one or more general-purpose processing devices such as a microprocessor, central processing unit, or the like. More particularly, the processor 502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 502 may also be one or more special-purpose processing devices such as an application specific integrated circuit (ASIC), a field programmable gate array (FPGA), a digital signal processor (DSP), network processor, or the like. Processor 502 is configured to execute the processing logic 526 for performing the operations described herein.

The computer system 500 may further include a network interface device 508. The computer system 500 also may include a video display unit 510 (e.g., a liquid crystal display (LCD), a light emitting diode display (LED), or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium (or more specifically a computer-readable storage medium) 532 on which is stored one or more sets of instructions (e.g., software 522) embodying any one or more of the methodologies or functions described herein. The software 522 may also reside, completely or at least partially, within the main memory 504 and/or within the processor 502 during execution thereof by the computer system 500, the main memory 504 and the processor 502 also constituting machine-readable storage media. The software 522 may further be transmitted or received over a network 520 via the network interface device 508.

While the machine-accessible storage medium 532 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

FIG. 6 illustrates an interposer 600 that includes one or more embodiments. The interposer 600 is an intervening substrate used to bridge a first substrate 602 to a second substrate 604. The first substrate 602 may be, for instance, an integrated circuit die. The second substrate 604 may be, for instance, a memory module, a computer motherboard, or another integrated circuit die. Generally, the purpose of an interposer 600 is to spread a connection to a wider pitch or to reroute a connection to a different connection. For example, an interposer 600 may couple an integrated circuit die to a ball grid array (BGA) 606—e.g., including or formed by one or more microbumps according to an embodiment—that can subsequently be coupled to the second substrate 604. In some embodiments, the first and second substrates 602, 604 are attached to opposing sides of the interposer 600. In other embodiments, the first and second substrates 602, 604 are attached to the same side of the interposer 600. And in further embodiments, three or more substrates are interconnected by way of the interposer 600.

The interposer 600 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 608 and vias 610, including but not limited to through-silicon vias (TSVs) 612. The interposer 600 may further include embedded devices 614, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 600. In accordance with some embodiments, apparatuses or processes disclosed herein may be used in the fabrication of interposer 600.

In one implementation, an integrated circuit (IC) package substrate comprises a dielectric layer having via holes formed therein, a sub-surface-level metal layer including copper contacts each exposed to a respective one of the via holes, the copper contacts including a first copper contact, a first surface finish on the first copper contact, a first seed layer deposited on the first copper contact, the first seed layer including copper, wherein the first seed layer is deposited on the first surface finish, a first microbump formed on the first seed layer, the first microbump including tin and zinc.

In one embodiment, a bottom ten percent of a volume of the first microbump has a first zinc mass fraction, wherein a top 10% of a volume of the first microbump has a second zinc mass fraction and wherein the second zinc mass fraction differs from the first zinc mass fraction by at least 5% of the first zinc mass fraction. In another embodiment, the second zinc mass fraction differs from the first zinc mass fraction by at least 10% of the first zinc mass fraction. In another embodiment, a total volume of zinc of the first microbump is equal to at least 5% of a total volume of tin of the first microbump. In another embodiment, the total volume of zinc of the first microbump is equal to at least 10% of the total volume of tin of the first microbump. In another embodiment, a total zinc mass fraction of the first microbump is in a range of 5% to 30%. In another embodiment, the total zinc mass fraction of the first microbump is in a range of 5% to 20%. In another embodiment, the first seed layer further comprises titanium.

In another implementation, a method for forming microbumps on a substrate comprises patterning a dielectric layer, wherein a copper contact is exposed by an opening formed by the dielectric layer, forming a surface finish on the copper contact, performing a deposition of a seed layer directly on the surface finish, the seed layer including copper, electroplating tin of a first microbump directly on the seed layer, and electroplating zinc of the first microbump directly on the tin.

In one embodiment, the tin of the microbump is electroplated directly on the copper seed layer. In another embodiment, a bottom ten percent of a volume of the first microbump has a first zinc mass fraction, wherein a top 10% of a volume of the first microbump has a second zinc mass fraction and wherein the second zinc mass fraction differs from the first zinc mass fraction by at least 5% of the first zinc mass fraction. In another embodiment, the second zinc mass fraction differs from the first zinc mass fraction by at least 10% of the first zinc mass fraction. In another embodiment, a total volume of zinc of the first microbump is equal to at least 5% of a total volume of tin of the first microbump. In another embodiment, the total volume of zinc of the first microbump is equal to at least 10% of the total volume of tin of the first microbump. In another embodiment, a total zinc mass fraction of the first microbump is in a range of 5% to 30%. In another embodiment, the total zinc mass fraction of the first microbump is in a range of 5% to 20%.

In another implementation, a device comprises an integrated circuit (IC) die and a substrate including a dielectric layer having via holes formed therein, a sub-surface-level metal layer including copper contacts each adjoining a respective one of the via holes, the copper contacts including a first copper contact, and a first seed layer deposited on the first copper contact, the first seed layer including copper. The device further comprises solder joints including a first solder joint comprising zinc and tin, wherein the IC die and the first copper contact are coupled to each other via the first solder joint.

In one embodiment, a bottom ten percent of a volume of the first microbump has a first zinc mass fraction, wherein a top 10% of a volume of the first microbump has a second zinc mass fraction and wherein the second zinc mass fraction differs from the first zinc mass fraction by at least 5% of the first zinc mass fraction. In another embodiment, the second zinc mass fraction differs from the first zinc mass fraction by at least 10% of the first zinc mass fraction. In another embodiment, a total volume of zinc of the first microbump is equal to at least 5% of a total volume of tin of the first microbump. In another embodiment, the total volume of zinc of the first microbump is equal to at least 10% of the total volume of tin of the first microbump. In another embodiment, a total zinc mass fraction of the first microbump is in a range of 5% to 30%. In another embodiment, the total zinc mass fraction of the first microbump is in a range of 5% to 20%. In another embodiment, the first seed layer further comprises titanium.

Techniques and architectures for fabricating interconnect structures including Tin are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A method for forming microbumps on a substrate, the method comprising:
    patterning a dielectric layer, wherein a copper contact is exposed by an opening formed by the dielectric layer;
    forming a surface finish directly on the copper contact;
    performing a deposition of a seed layer directly on the surface finish, the seed layer including copper;
    electroplating tin of a first microbump directly on the seed layer; and
    electroplating zinc of the first microbump directly on the tin.

2. The method of claim 1, wherein the tin of the microbump is electroplated directly on the copper seed layer.

3. The method of claim 1 wherein a bottom ten percent of a volume of the first microbump has a first zinc mass fraction, wherein a top 10% of a volume of the first microbump has a second zinc mass fraction and wherein the second zinc mass fraction differs from the first zinc mass fraction by at least 5% of the first zinc mass fraction.

4. The method of claim 3, wherein the second zinc mass fraction differs from the first zinc mass fraction by at least 10% of the first zinc mass fraction.

5. The method of claim 1, wherein a total volume of zinc of the first microbump is equal to at least 5% of a total volume of tin of the first microbump.

6. The method of claim 5, wherein the total volume of zinc of the first microbump is equal to at least 10% of the total volume of tin of the first microbump.

7. The method of claim 1, wherein a total zinc mass fraction of the first microbump is in a range of 5% to 30%.

8. The method of claim 7, wherein the total zinc mass fraction of the first microbump is in a range of 5% to 20%.

* * * * *